United States Patent [19]
Dell et al.

[11] Patent Number: 6,130,475
[45] Date of Patent: Oct. 10, 2000

[54] CLOCK DISTRIBUTION SYSTEM FOR SYNCHRONOUS CIRCUIT ASSEMBLIES

[75] Inventors: Timothy Jay Dell, Colchester; George Cheng-Cwo Feng; Mark William Kellogg, both of Essex Junction, all of Vt.

[73] Assignee: International Business Machines Corporation, Armonk, N.Y.

[21] Appl. No.: 08/163,447

[22] Filed: Dec. 7, 1993

[51] Int. Cl.⁷ .......................... H01L 23/02; H01L 23/48; H01L 23/52
[52] U.S. Cl. .......................... 257/678; 257/690; 257/691; 307/480; 307/303.1
[58] Field of Search .................................. 307/480, 303.1; 257/916, 697, 690, 691, 693, 904

[56] References Cited

U.S. PATENT DOCUMENTS

| | | | |
|---|---|---|---|
| 4,639,615 | 1/1987 | Lee et al. | 307/269 |
| 5,216,278 | 6/1993 | Lin et al. | 257/737 |

FOREIGN PATENT DOCUMENTS 0366326  2/1990  European Pat. Off. .......... G06F 1/12

OTHER PUBLICATIONS

International Business Machines Corporation Technical Disclosure Bulletin vol. 32 No. 10A Mar. 1990 Title: Termination Circuitry For Multiple Differential Clock Copies pp. 371–372.

"Basic Engineering Circuit Analysis", pp. 332–333; David Irwin.

"Webster's II New Riverside Inversity Dictionary"; pp. 613 & 978.

*Primary Examiner*—David Hardy
*Assistant Examiner*—Jhihan B. Clark
*Attorney, Agent, or Firm*—Howard J. Walter, Jr.

[57] ABSTRACT

A packaging assembly for semiconductor memory modules using synchronous clocking signals distributed to each module within a package. The clock distribution network on the assembly is characterized by including a transmission line termination means, preferably a resistor, coupled immediately adjacent to one of the assembly input pins.

6 Claims, 7 Drawing Sheets

CLOCK DISTRIBUTION SYSTEM FOR SYNCHRONOUS CIRCUIT ASSEMBLIES

FIELD OF THE INVENTION

The present invention relates to synchronous semiconductor circuit assemblies and particularly to synchronous dynamic random access memories packaged in a multiple memory unit or module.

PRIOR ART

Synchronous memory devices are a recent addition to the large portfolio of semiconductor memories. Virtually all of currently available semiconductor Dynamic Random Access Memory (DRAM) and Static Random Access Memory (SRAM) devices use asychronous clocking systems in that the clocking signals necessary to perform memory access functions are not synchronized to that of an associated system processor. Although memories are initiated by signals sent by the processor, the exact time interval between the time a request is sent to a memory and the time a response will be received is dependent on the particular internal features of the memory. Thus, it becomes necessary for system designers to allow for the "worse case" response time between requests for information and the anticipated time the information will be available. Such clocking systems have led to great amounts of wasted time in the handling of memory functions in computer processors.

While semiconductor processing technologies have enabled logic components such as microprocessors to operate at in excess of 100 megahertz (Mhz) clock rates, memory systems have until recently not met the same rates because of the nature of the operations necessary to be performed.

In order to meet the challenge of high speed processors, synchronous memory devices have been described. These memories are responsive to a high frequency clock signals generated by the processor, or at least in synchronization with the processor, which render all internal activity within the memory "synchronous" with other devices responsive to the same clock signals.

Currently, several synchronous memory designs have been proposed and fabricated. These memory devices have the capability of utilizing external clock rates of nearly the same rates as that of processors.

A particular problem presented by the proposed use of synchronous memory devices lies in the packaging and clock distribution of clock signals within memory packages. Due to the extremely high frequency of the clock pulses used the successful design of clock distribution networks has been frustrated by failure.

Referring to FIG. 1 there is shown a typical DRAM SIMM package 10 having a plurality of memory modules 12 mounted on one or both sides. Input/output pins 14 are provided to access modules on the package. Synchronous clocking signals are applied to pin 16 and coupled to clock distribution network 18. Because of the physical distribution of the memory modules and the inherent impedance in the distribution network, the clock signals are found to deteriorate to a point as to be unsuitable for use. This signal deterioration problem is aggravated as the frequency of the clock signals increases. FIG. 2 illustrates the signal levels of the distribution network of the package of FIG. 1 using a clock rate of 100 Mhz. As can be seen, the original clock signal voltage 20 is significantly destroyed at both the left and right ends of the network as shown by trace 24. Various clock distribution network layouts have been unsuccessfully tried, as illustrated in FIG. 3 which shows a multiple branched network, FIG. 4 which shows a three branch network, FIG. 5 showing the use of line terminating resistors 26 and FIG. 6 which shows breaking the network into two separate networks.

Additional prior art relating to distribution of extremely high frequency clock signals in packages such as SRAM SIMMs is limited. U.S. Pat. No. 5,109,168 to Rusu teaches that it can be important to provide balanced distribution networks in integrated circuits. However, such a teaching appears not to be relevant to the solution to the synchronous clock distribution problem as portrayed by FIGS. 1–6.

SUMMARY OF THE INVENTION

Accordingly, it is an object of the invention to provide a synchronous clock distribution network for applying clock signals in excess of 100 Mhz to semiconductor packages containing a plurality of memory or other devices.

It is another object of the invention to provide a solution to the packaging problems faced by SRAM and DRAM circuit designers.

These and other objects are accomplished by designing a clock distribution network in which the clock signal as received at the package pins is substantially free of noise generated between the clock generator and the package. This is accomplished by placing a transmission line termination impedance, namely a resistor, immediately adjacent to the clock input pin on the package. An alternative embodiment provides for the impedance to be placed at adjacent to the socket which receives the clock pin.

The invention will be more clearly appreciated by reference to the specification and attached drawings.

DETAILED DESCRIPTION OF THE INVENTION

Figure 1:
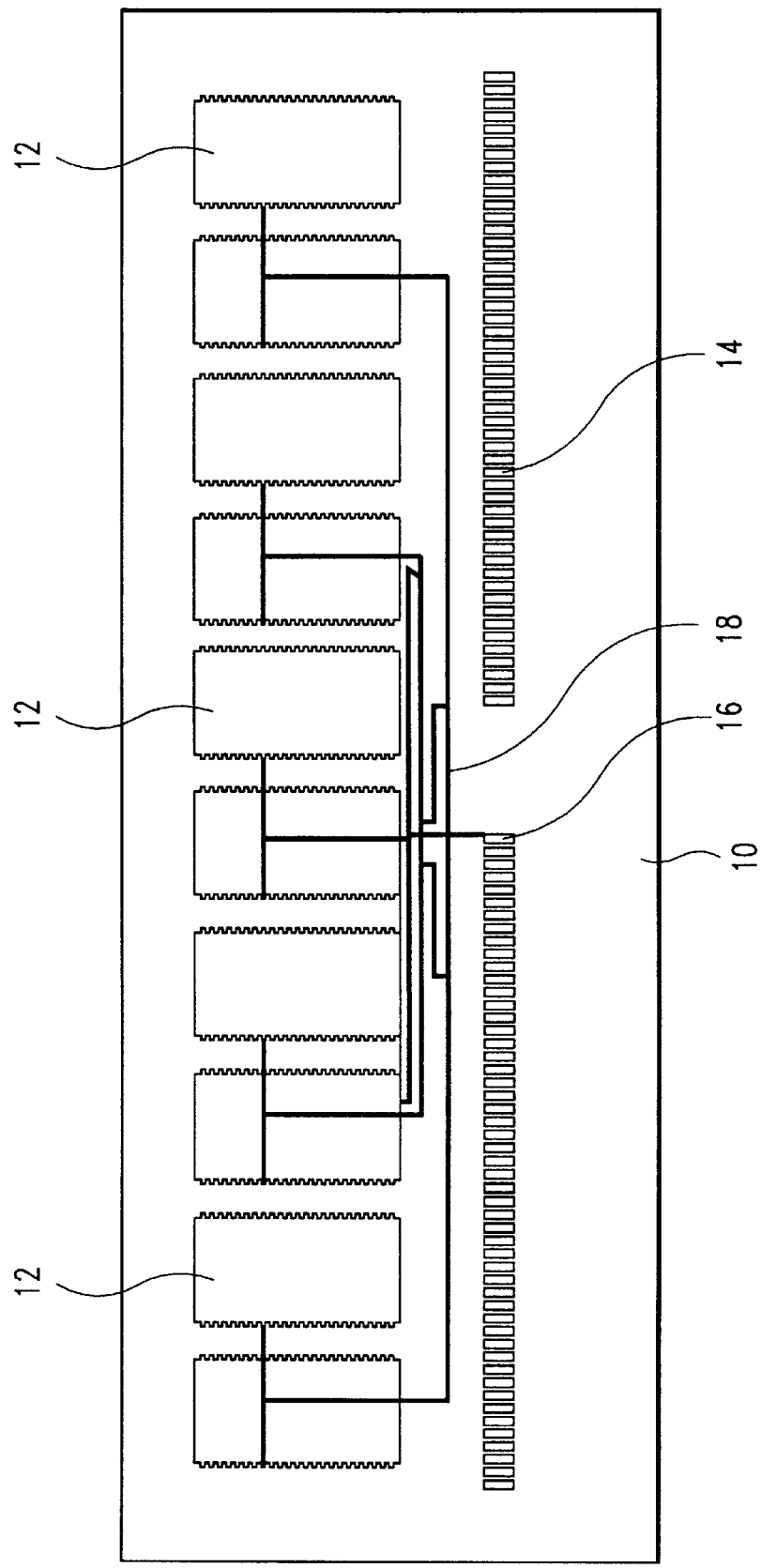
FIG. 1 is a schematic illustration of a memory SIMM showing a clock wiring layout proposed in the prior art.
Figure 2:
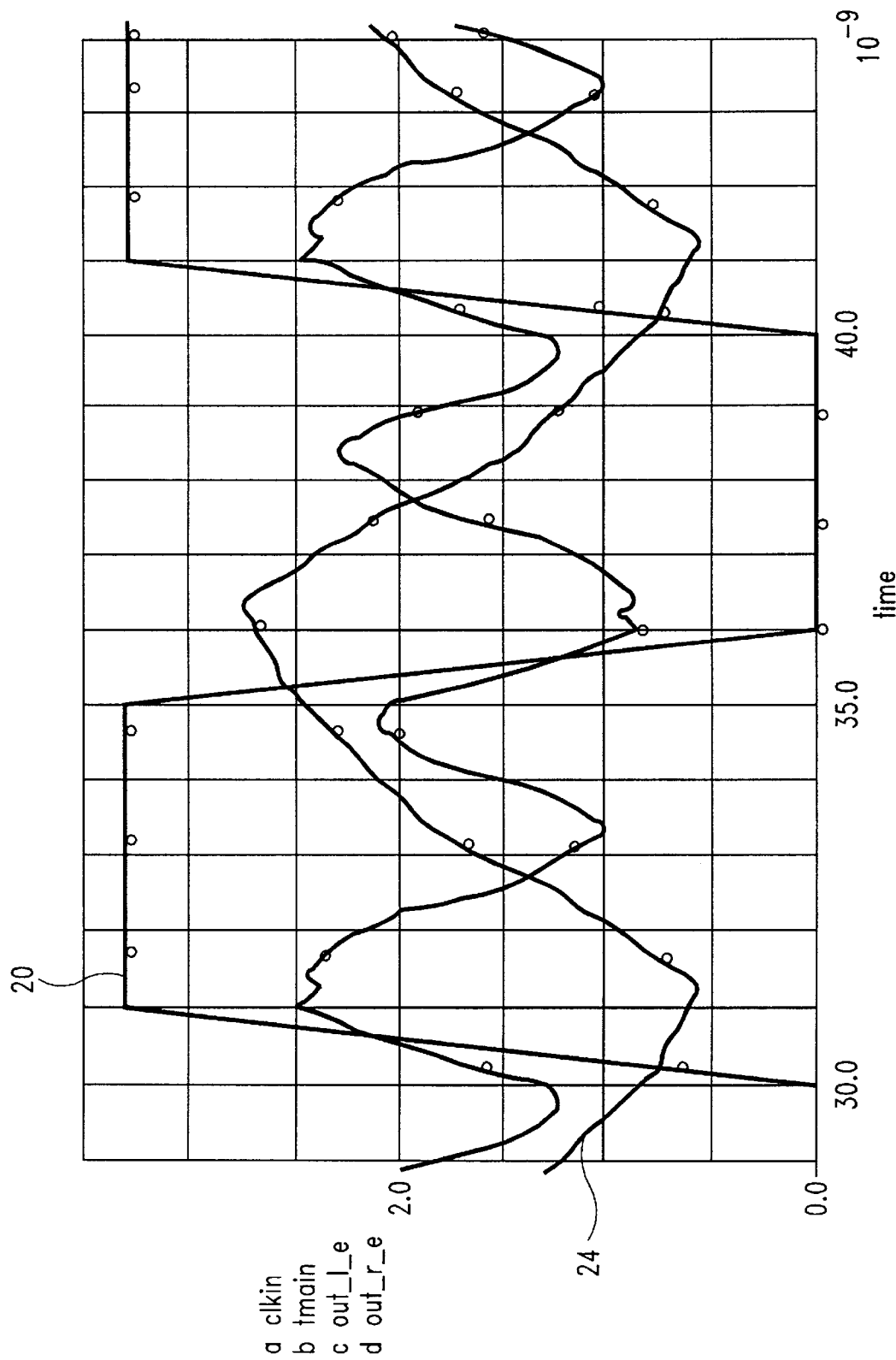
FIG. 2 is a simulated voltage waveform trace of clock signals present using the layout of FIG. 1 at 100 MHz.
Figure 3:
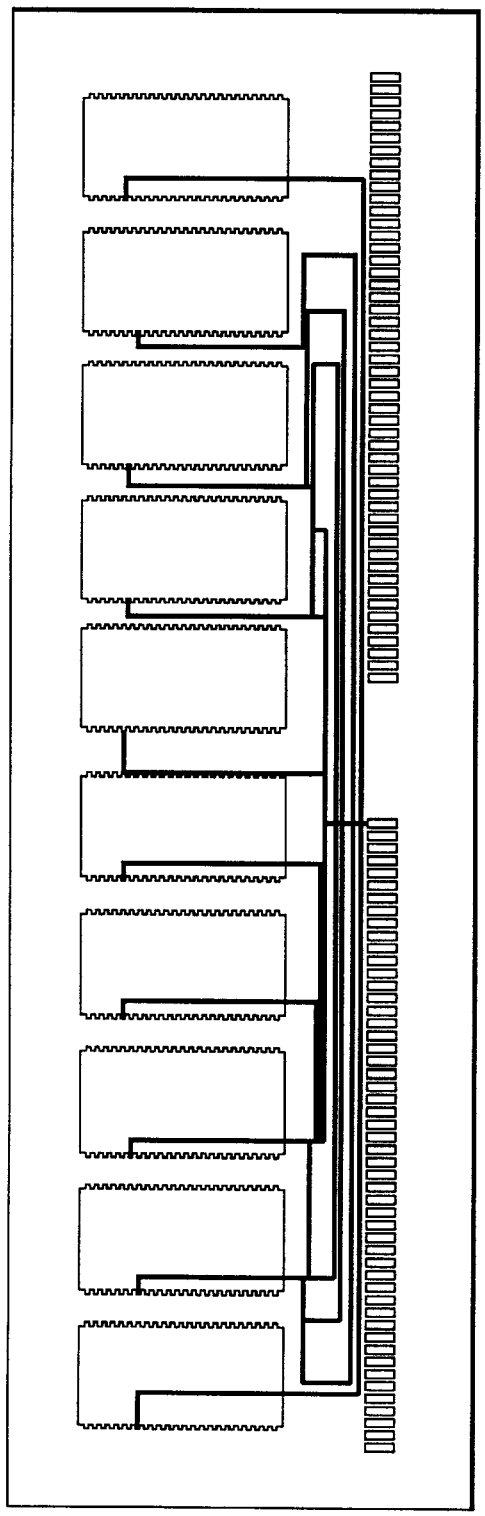
FIG. 3 is another prior art layout for synchronous DRAM SIMM clock distribution.
Figure 4:
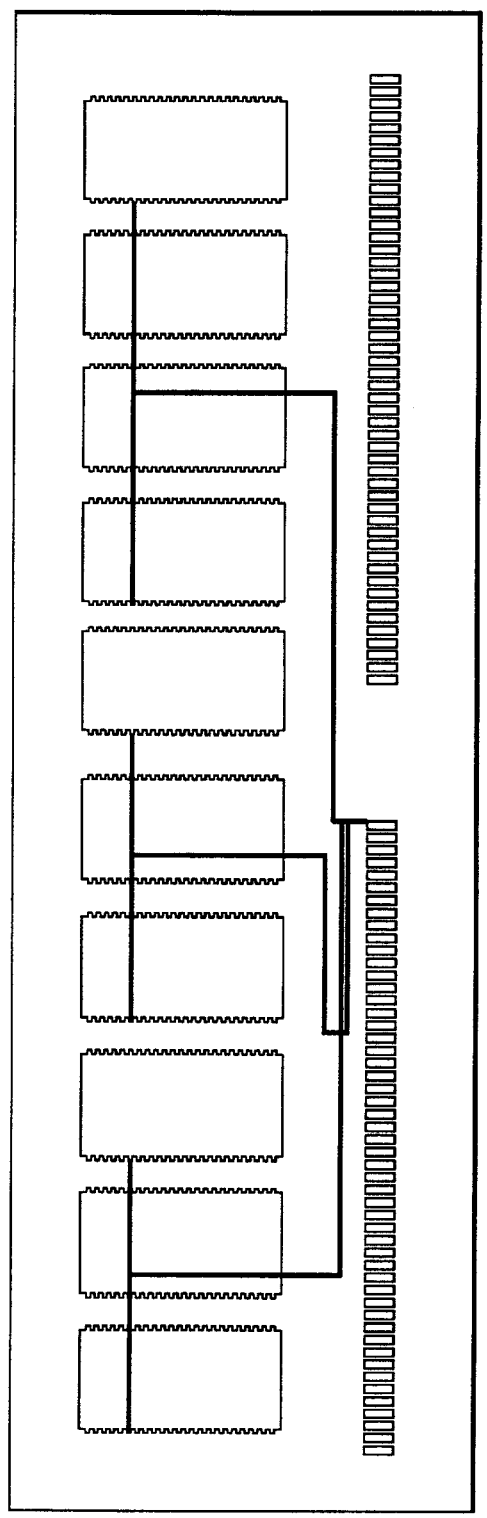
FIG. 4 is yet another prior art layout for synchronous DRAM SIMM clock distribution.
Figure 5:
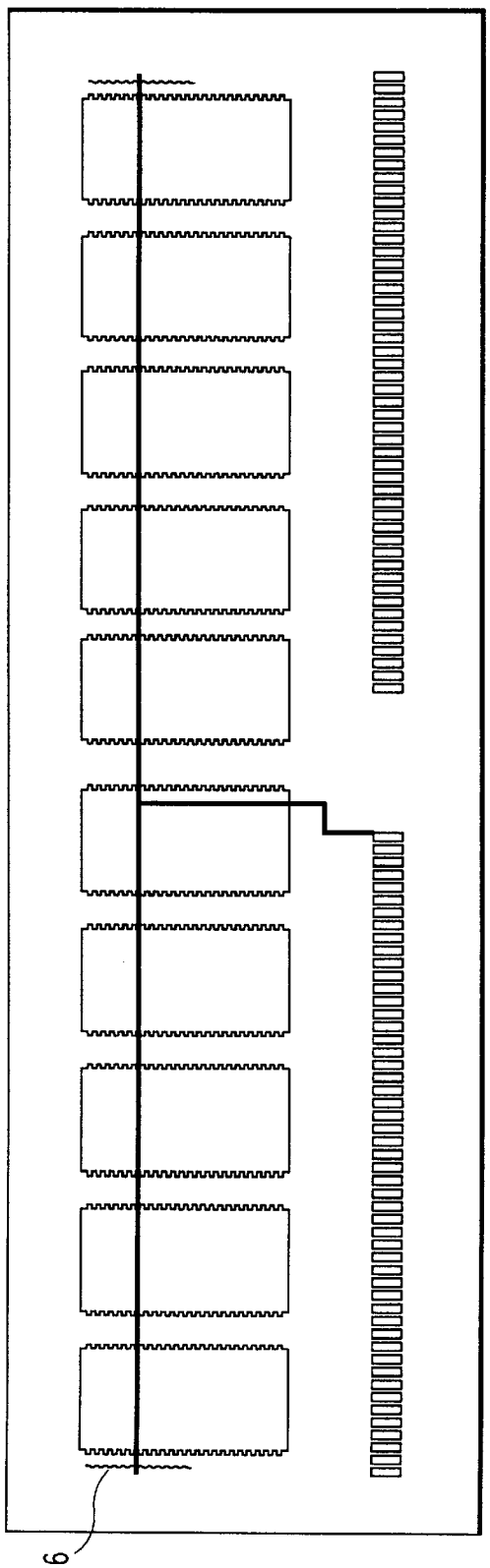
FIG. 5 is a prior art synchronous DRAM SIMM clock distribution layout using resistive line terminators.
Figure 6:
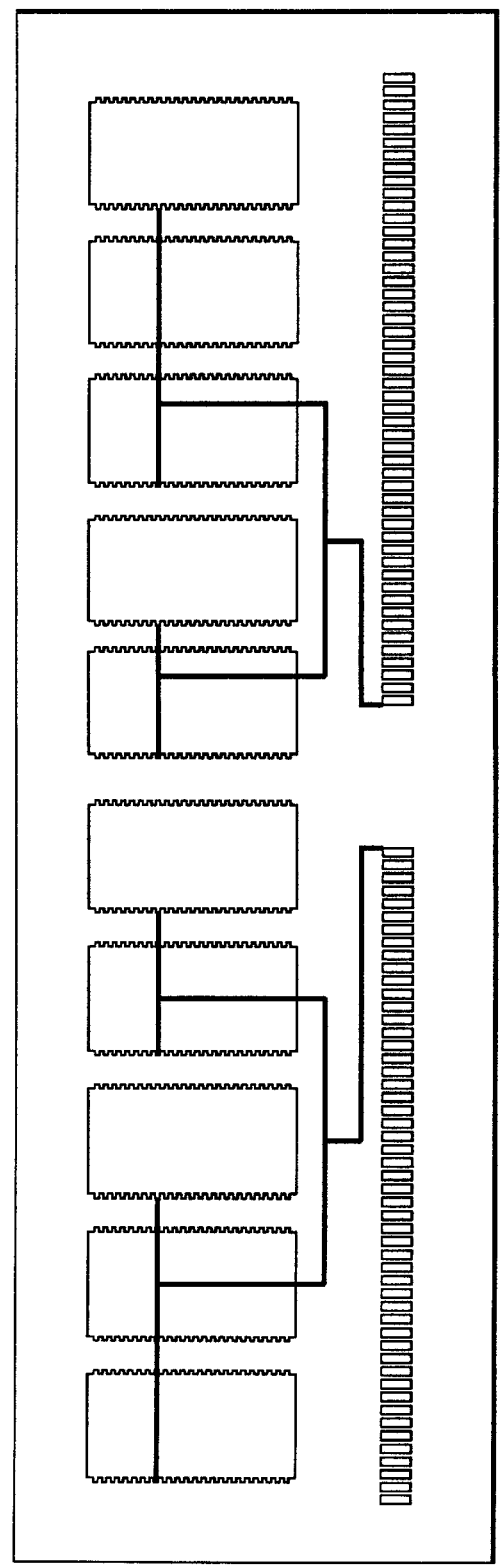
FIG. 6 is a final prior art synchronous DRAM SIMM clock distribution layout using two independent clock signal input pins to the SIMM.
Figure 7:
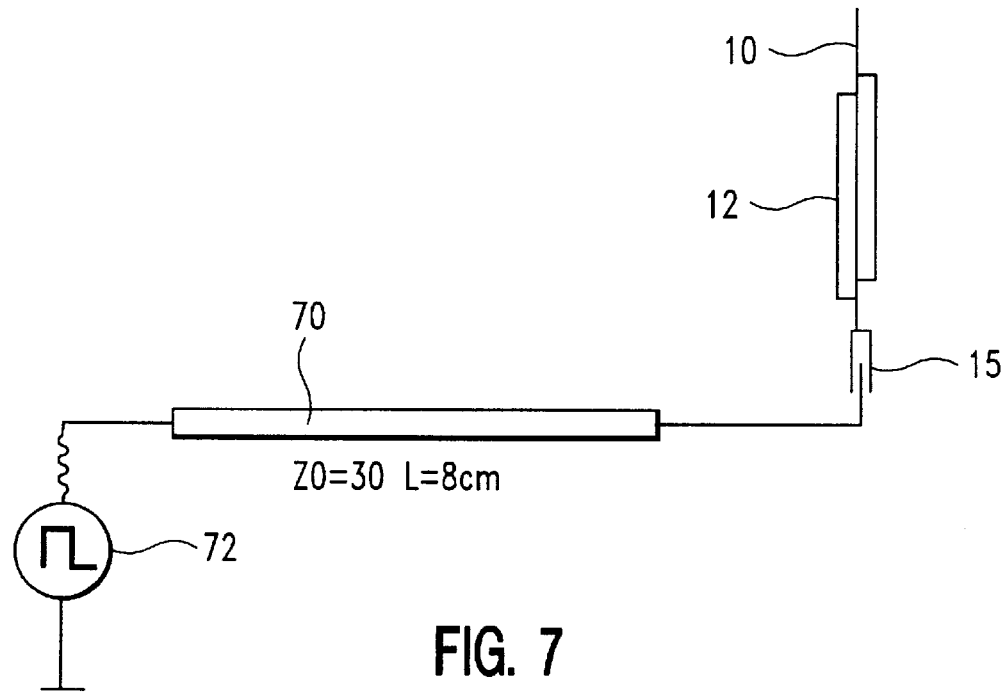
FIG. 7 is a circuit diagram representing the equivalent circuit for a DRAM SIMM showing the primary impedances.

Referring to FIG. 7 there is shown a schematic equivalent circuit for a semiconductor package as illustrated in FIGS.

1–6. An impedance 70 represents the card and associated structures between the clock generator 72 and the semiconductor package 10 including memory modules 12. Reference 15 represents the connector into which the pins on the package 10 are inserted.

Figure 8A:
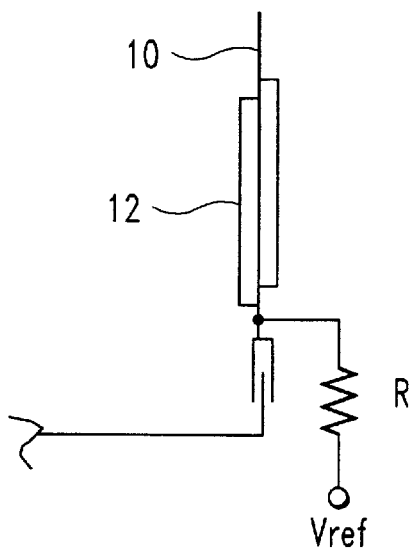
FIG. 8A is a partial circuit diagram illustrating the modification of the equivalent circuit to demonstrate the first embodiment of the invention.

FIG. 8A is a circuit diagram of a first embodiment of the invention and shows the addition of a resistor R immediately adjacent to the clock input pin.

Figure 8B:
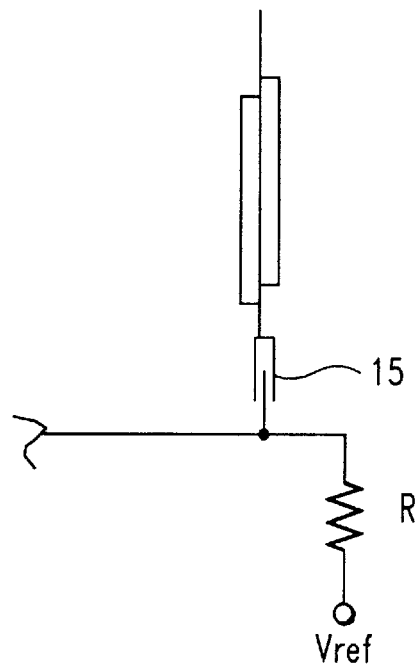
FIG. 8B is a partial circuit diagram illustrating the equivalent circuit to demonstrate the second embodiment of the invention.

FIG. 8B is a circuit diagram of the second embodiment of the invention and shows the addition of resistor R to the card side of the connector 15.

Figure 9:
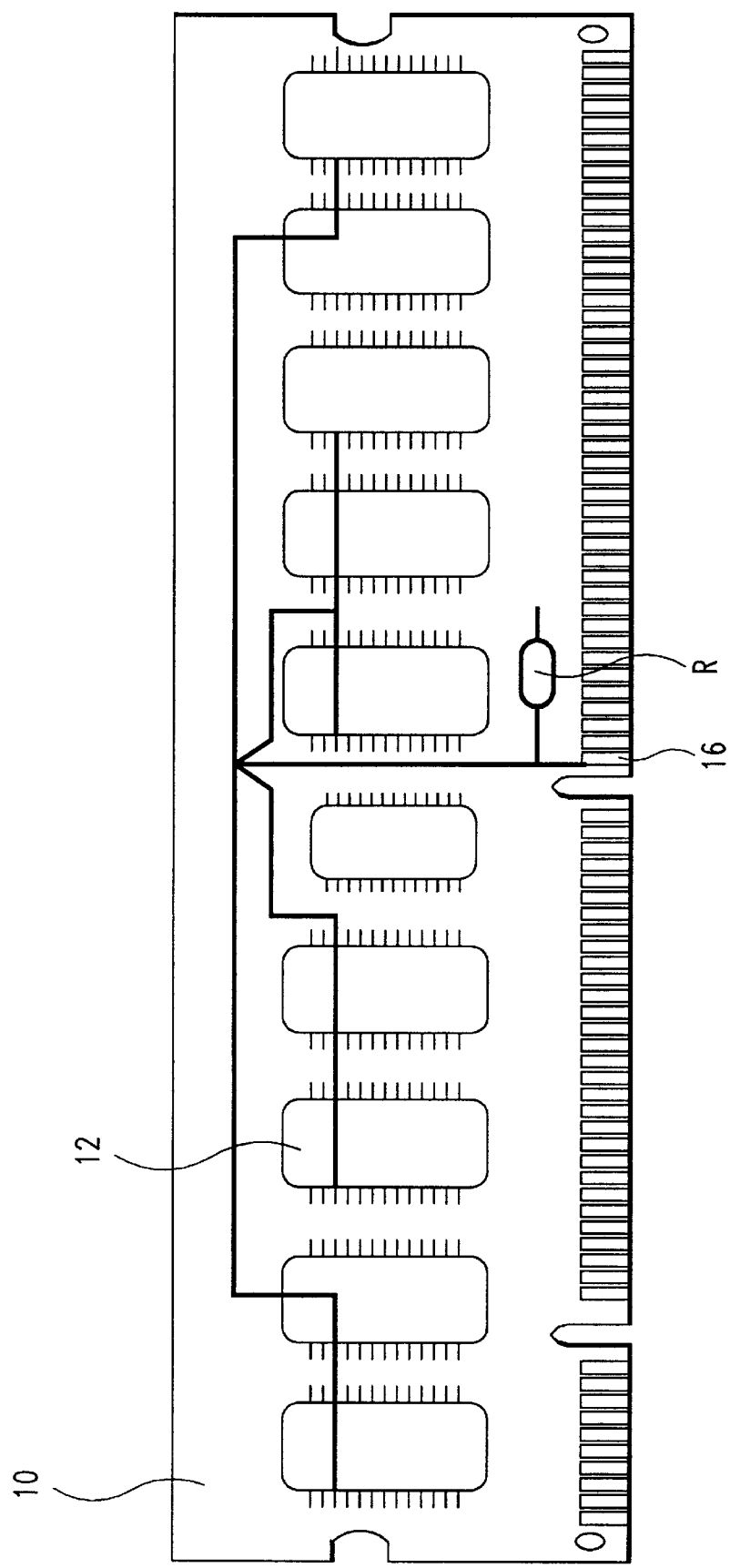
FIG. 9 is a schematic representation of the preferred embodiment of the invention showing the terminating resistor adjacent the SIMM I/O pin for the clock signal.

FIG. 9 shows a schematic diagram of the implementation of the first embodiment of the invention showing resistor R immediately adjacent to clock input pin 16.

Figure 10:
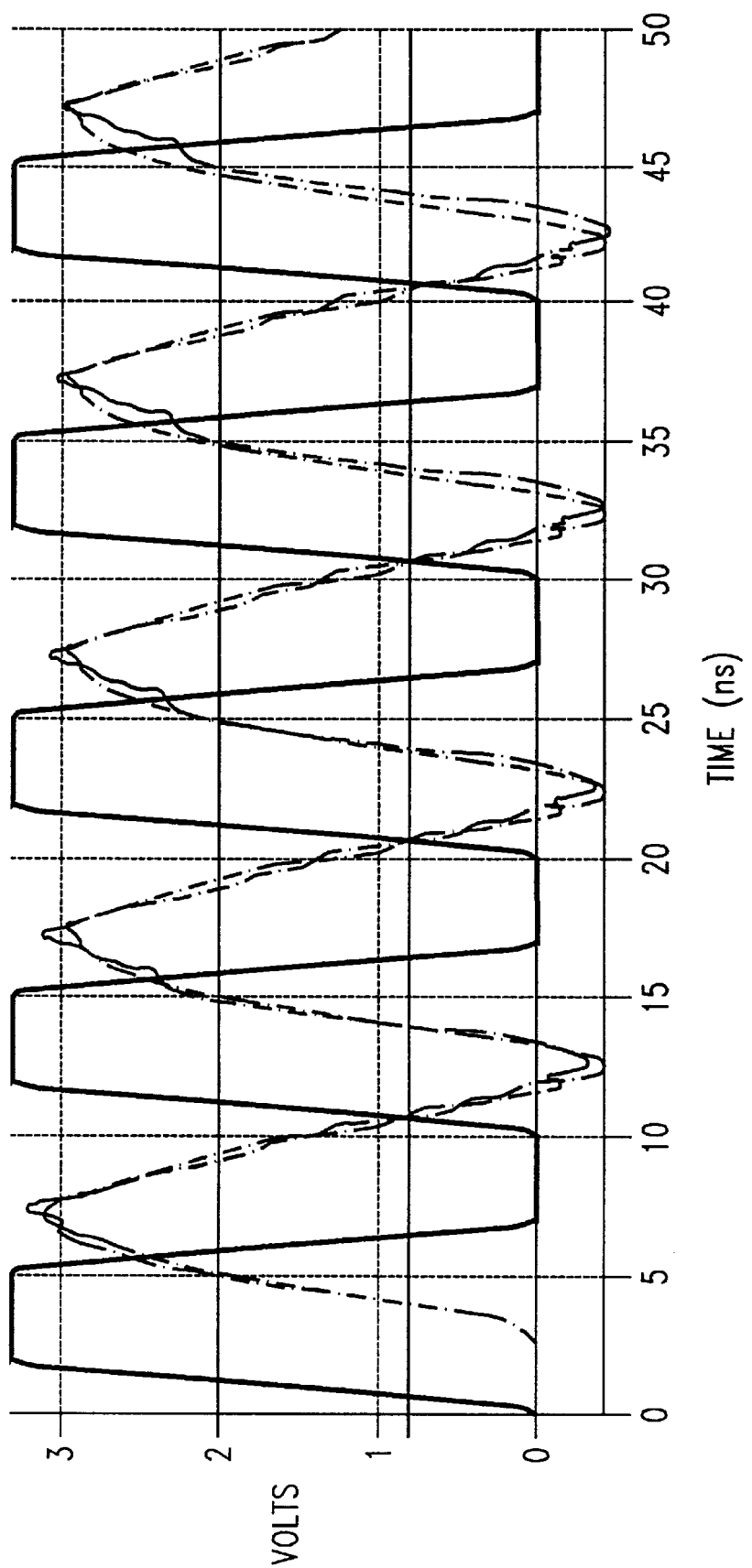
FIG. 10 is a simulated waveform of the clock signals present at various locations on a DRAM SIMM when the invention is used with a clock of 100 MHz.

Hardware embodiments have shown that the first embodiment provides voltage waveforms as seen in FIG. 10 which clearly shows that the clock signals are not attenuated in any substantial way.

While the invention has been described in terms of only two embodiments, those skilled in the art will recognize that various modifications can be made. For example, the semiconductor devices can be logic devices and/or mixed logic and memory devices.

What is claimed is:

1. A semiconductor assembly comprising:
    a plurality of semiconductor devices each responsive to a clocking signal applied to the device via at least one clock input lead associated with said device;
    a packaging assembly for supporting said plurality of semiconductor devices, each of said semiconductor devices being spaced a predetermined distance from each other;
    a plurality of packaging assembly input/output pins arranged in spaced relationship for coupling signals to at least some of said semiconductor devices from an external source;
    at least one clock input pin arranged with said input/output pins for coupling a clocking signal to said semiconductor devices;
    common clock distribution means coupled between said clock input pin and said clock input leads of said semiconductor devices; and
    fixed impedance means connected between said common clock distribution means and a reference voltage, said impedance means being physically located adjacent to said clock input pin and between said clock input pin and said semiconductor devices.

2. The semiconductor assembly of claim 1 wherein said impedance means is a resistor.

3. The semiconductor assembly of claim 1 wherein at least some of said semiconductor devices are memory devices.

4. The semiconductor assembly of claim 1 wherein said reference voltage is ground.

5. The semiconductor assembly of claim 3 wherein said memory devices are synchronous memory devices.

6. The semiconductor assembly of claim 5 wherein there is a single, clock distribution means on said packaging assembly.

* * * * *